United States Patent
Williams et al.

(10) Patent No.: US 9,953,110 B2
(45) Date of Patent: Apr. 24, 2018

(54) APPARATUS AND METHOD FOR INTERACTIVELY EXTRACTING SHAPES FROM A POINT CLOUD

(71) Applicant: ClearEdge3D, Inc., Manassas, VA (US)

(72) Inventors: Kevin S. Williams, Marshall, VA (US); Dawei Du, Marshall, VA (US)

(73) Assignee: CLEAREDGE3D, INC., Marshall, VA (US)

( * ) Notice: Subject to any disclaimer, the term of this patent is extended or adjusted under 35 U.S.C. 154(b) by 109 days.

(21) Appl. No.: 15/018,690

(22) Filed: Feb. 8, 2016

(65) Prior Publication Data

US 2016/0232259 A1 Aug. 11, 2016

Related U.S. Application Data

(60) Provisional application No. 62/112,708, filed on Feb. 6, 2015.

(51) Int. Cl.

| | |
|---|---|
| *G06T 15/40* | (2011.01) |
| *G06F 17/50* | (2006.01) |
| *G06T 17/20* | (2006.01) |
| *G06T 19/20* | (2011.01) |
| *G06T 17/10* | (2006.01) |

(52) U.S. Cl.
CPC ............. *G06F 17/50* (2013.01); *G06T 17/20* (2013.01); *G06T 17/10* (2013.01); *G06T 19/20* (2013.01); *G06T 2207/10028* (2013.01)

(58) Field of Classification Search
CPC ........... G06T 19/20; G06T 2207/10028; G06T 17/10; G06F 17/50
See application file for complete search history.

(56) References Cited

U.S. PATENT DOCUMENTS

| | | | | |
|---|---|---|---|---|
| 9,202,314 | B2* | 12/2015 | Muto | G06T 19/20 |
| 2011/0080475 | A1* | 4/2011 | Lee | G06F 3/017 |
| | | | | 348/77 |
| 2015/0145855 | A1* | 5/2015 | Glover | G06T 19/003 |
| | | | | 345/419 |

OTHER PUBLICATIONS

Leica Cyclone Software Application, "Leica Cyclone 3D Point Cloud Processing Software," Leica Geosystems AG, Hexagon Geosystems, Dec. 16, 2016, <http://hds.leica-geosystems.com/en/Leica-Cyclone_6515.htm>.

(Continued)

*Primary Examiner* — Robert Craddock
(74) *Attorney, Agent, or Firm* — Hauptman Ham, LLP

(57) ABSTRACT

A system for constructing a virtual 3D model of one or more objects within a scene, where the virtual 3D model contains one or more flat faces on each object constructed. In some embodiments, the system may include at least one processing device configured to: receive, through a data interface, data describing a set of measurements of observed portions of the one or more objects in the scene, where the set of measurements was performed by one or more measurement devices; receive, through a data interface or user input device, one or more shape definitions, where the shape definitions define the possible shapes of a virtual 3D model of an object, and where the virtual 3D model of an object is to be constructed from the measurement data, and where the shapes contain one or more regions with primitive geometries.

22 Claims, 6 Drawing Sheets

(56) References Cited

OTHER PUBLICATIONS

LFM Modeler Software Application "LFM NetView," LFM Software Limited, Aveva Group, Manchester, United Kingdom, Dec. 16, 2016, <http://web.lfm-software.com/en/LFM-Products.aspx#link:/en/lightbox/LFM%20NetView%20Lighbox.aspx>.
Faro Kubit PointSense Software Application, Faro USA, Houston, TX, Dec. 16, 2016, <http://us.faro3dsoftware.com/CAD/Products/PointSense/>.

* cited by examiner

APPARATUS AND METHOD FOR INTERACTIVELY EXTRACTING SHAPES FROM A POINT CLOUD

BACKGROUND

Civil and mechanical engineering projects, GIS (Geographical Information Systems) mapping programs, military simulations, and numerous other applications all require accurate three dimensional (3D) computer models of real-world objects.

Most previous methods for creating 3D models involve extensive manual measurement and modeling. The measuring component may be achieved either through direct measurement (such as surveying) of the objects themselves or through measuring images of the objects using the science of photogrammetry. The modeling component typically involves manually inputting the measurements into computer modeling programs such as computer-aided design (CAD) software, GIS, or other similar solid modeling packages. This process is labor intensive and error prone.

Point cloud capture technology, such as laser scanning or automated photogrammetric stereo matching, is a relatively new technology for improving upon this 3D-modeling process. These systems scan objects or scenes to construct a "point cloud" consisting of many 3D point measurements of the scene. These points can then be used to guide the process of feature extraction.

Many companies need virtual 3D models of their industrial facilities, and it has become accepted practice to scan these facilities and create these virtual 3D models using the resulting point cloud data. Structural steel and other extruded shapes such as ducting, piping, and cable trays represent some of the most commonly modeled shapes. Unfortunately, modeling these types of items and accurately fitting them to the point cloud is very tedious with traditional CAD software.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
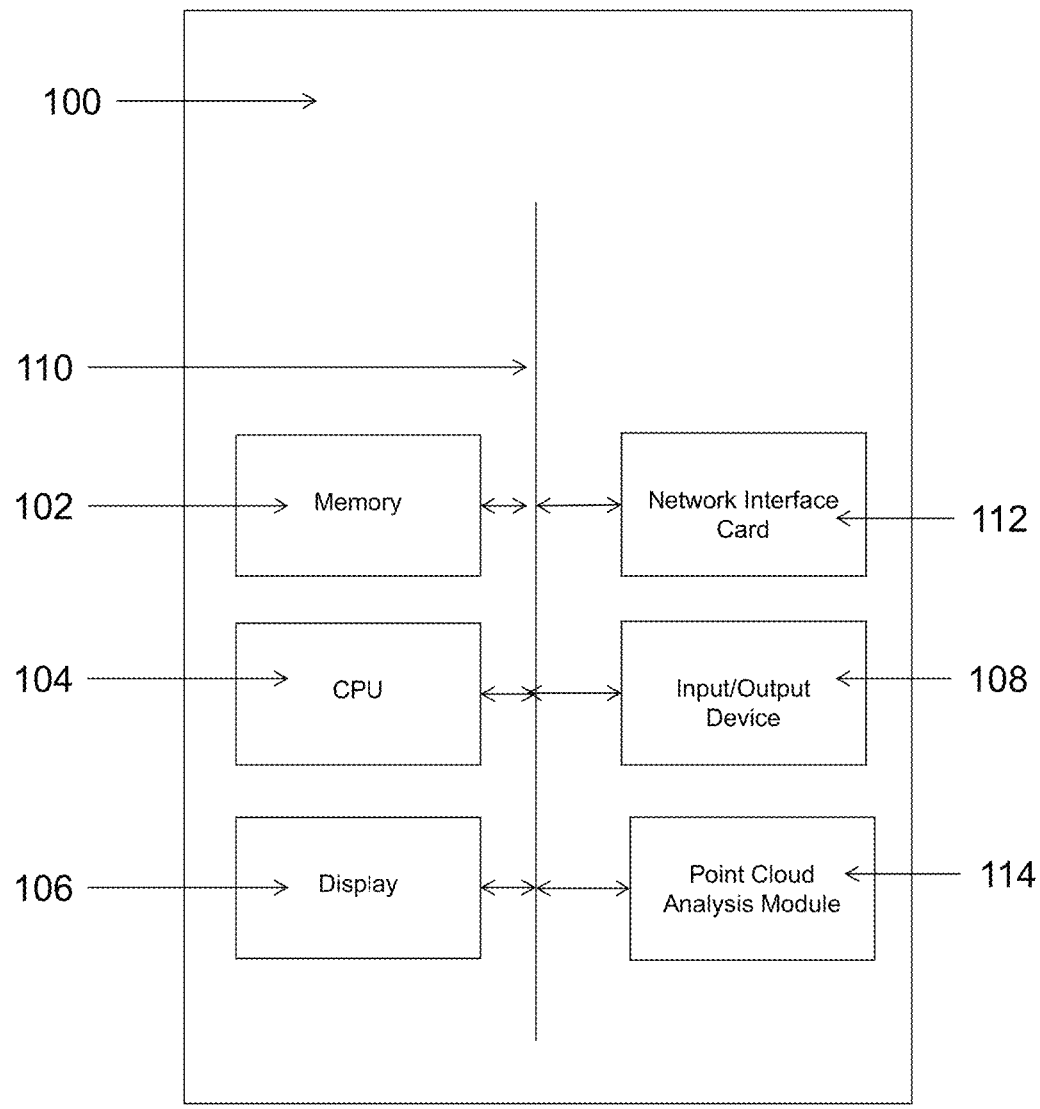
FIG. 1 is a block diagram of a computer configured in accordance with an embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more embodiments of the present invention provide a method of and apparatus for using measurements, such as those obtained from one or more laser scanners, of one or more objects within a scene to construct a virtual 3D model of the measured objects. Various features associated with the operation of one or more embodiments of the present invention will now be set forth. Prior to such description, a glossary of terms applicable for some embodiments is provided.

Scene: According to some embodiments, a scene includes or refers to a set of one or more physical objects.

Boundary representation model: According to some embodiments, a boundary representation model relies on the mathematical property that a filled-in geometric D-dimensional region is completely specified if one specifies the (D−1)-dimensional boundary of that region and specifies which side of the boundary the filled-in region is. So the shape of a 3D object is specified by specifying the (2D) faces in 3D space that form its boundary. Similarly, the 2D faces are specified by specifying a 2D surface geometry (such as a plane or a cylinder) and a 1D surface boundary lying upon the surface geometry (such as the four sides of a rectangle) in at least some embodiments. In at least some embodiments, this 1D surface boundary is described as a collection of 1D edges, which are specified as a 1D edge geometry lying upon the surface geometry and a pair of end vertices (if the edge is an open set, such as a line segment) or an empty set of vertices (if the edge is a closed set, such as a circle, for which the boundary is by definition empty). According to some embodiments, the concept of edge, surface, and vertex geometries are generalized to include a thickness, so that, e.g., an edge geometry consists of a thin tube of points centered on a central 1D curve. These methods of representing geometry are utilized by solid modeling kernels such as the 3D ACIS® Modeler, which is commercially available from Spatial Corp., Boulder, Colo.

Face: According to some embodiments, a face refers to a two-dimensional element of the boundary of a solid model. The geometry of a particular face is typically defined as a connected two-dimensional subset of a particular surface on the boundary of the solid model. Adjacent faces are typically separated by a collection of edges and/or vertices. For example, each face of a cube is a square.

Flat Face: According to some embodiments, a flat face refers to a face which has a planar shape. For example, each face of a cube is flat.

3D Model: According to some embodiments, a 3D Model describes a set of points in a 3D space. In some embodiments, this is a collection of one or more faces that describe the boundary or a portion of the boundary of a set of one or more objects. For example, a 3D model that contains the top and bottom faces of a cube would be a 3D model that describes a portion of the boundary of the cube. Similarly, a 3D model that contains all six faces of a cube would be a 3D model that describes the (entire) boundary of the cube. In some embodiments, faces that describe adjacent portions of the boundary of an object are stitched together, meaning that their face boundaries share one or more edges and/or vertices.

Virtual 3D Model: According to some embodiments, a virtual 3D Model includes a set of data, residing in a memory 102 of a computer system 100 as illustrated in FIG. 1, which describes a 3D Model.

Shape: According to some embodiments, two objects have the same shape if one can be rotated and/or translated to occupy the same set of points as the other, and do not have the same shape if this is not the case. For example, consider a sphere S which has a radius of R1. In some embodiments, a sphere in another location which also has a radius of R1 will have the same shape as S, while a sphere with radius R2 (different from R1) or a cylinder will have a different shape than S.

Shape Template: According to some embodiments, a shape template is a description of a set of shapes that, when combined with a set of parameter values, specify a shape. For example, some embodiments include a shape template for cylinders which, when combined with a radius value and a height value, specifies a particular cylindrical shape.

Shape Definition: According to some embodiments, a shape definition is a set of information that specifies a particular shape. For example, in some embodiments a shape definition for a particular cylindrical shape consists of a cylindrical shape template, a radius value, and a height value.

Continuous Parameter: According to some embodiments, a continuous parameter is a parameter that can take on a value within an interval of possible values. For example, in some embodiments the length of an extruded shape such as an I-Beam is a continuous parameter.

Primitive Geometry: According to some embodiments, a primitive geometry is a geometric shape that can be described by a finite set of parameters. For example, in some embodiments planes, cylinders, spheres, tori, and/or B-Spline surfaces are examples of primitive geometries.

Data Interface: According to some embodiments, a data interface includes a portion of a computer system that allows data to be loaded onto the computer system. In some embodiments a Network Interface Card 312 operates as a data interface, allowing data to be loaded across a network. In some embodiments, an input/output device operates as a data interface. In some embodiments, a removable memory device or removable memory media operates as a data interface, allowing data to be loaded by attaching the device or by loading the media. This list of embodiments is not exclusive; other forms of a data interface appear in other embodiments.

3D Graphical Representation: According to some embodiments, a 3D graphical representation is a representation of real objects and/or virtual objects and/or data in such a way that spatial relationships can be inferred. For example, in some embodiments a 3D graphical representation of a cube is a perspective rendering of the cube on a display device. As a further example, in some embodiments a 3D graphical representation of a set of points is a perspective rendering of a collection of the points on a display device. It should be noted that this is not an exclusive list of embodiments of this portion of the invention, other embodiments are possible.

The following paragraphs describe one or more embodiments for interactively extracting volumes of extrusion from a point cloud, but the same process may be used to extract other objects such as cylinders, cones, valves, flanges, pumps and other similar objects. In some embodiments, a method comprises receiving, through a data interface, data describing a set of measurements of one or more objects in the scene. A candidate shape is selected and a virtual spatial region of interest, which might contain a portion of an object for which a virtual 3D model is to be constructed, is identified. Virtual primitive geometries are generated and candidate positionings of candidate shapes are calculated. The method further comprises calculating a score for each combination of shape parameters and positioning and creating a virtual 3D model of an object based on the combination of shape and positioning with the best score. In some embodiments, the method further comprises optionally deciding if all desired shapes have been obtained. In some embodiments, the method further comprises optionally saving the resulting virtual 3D model.

Figure 2:
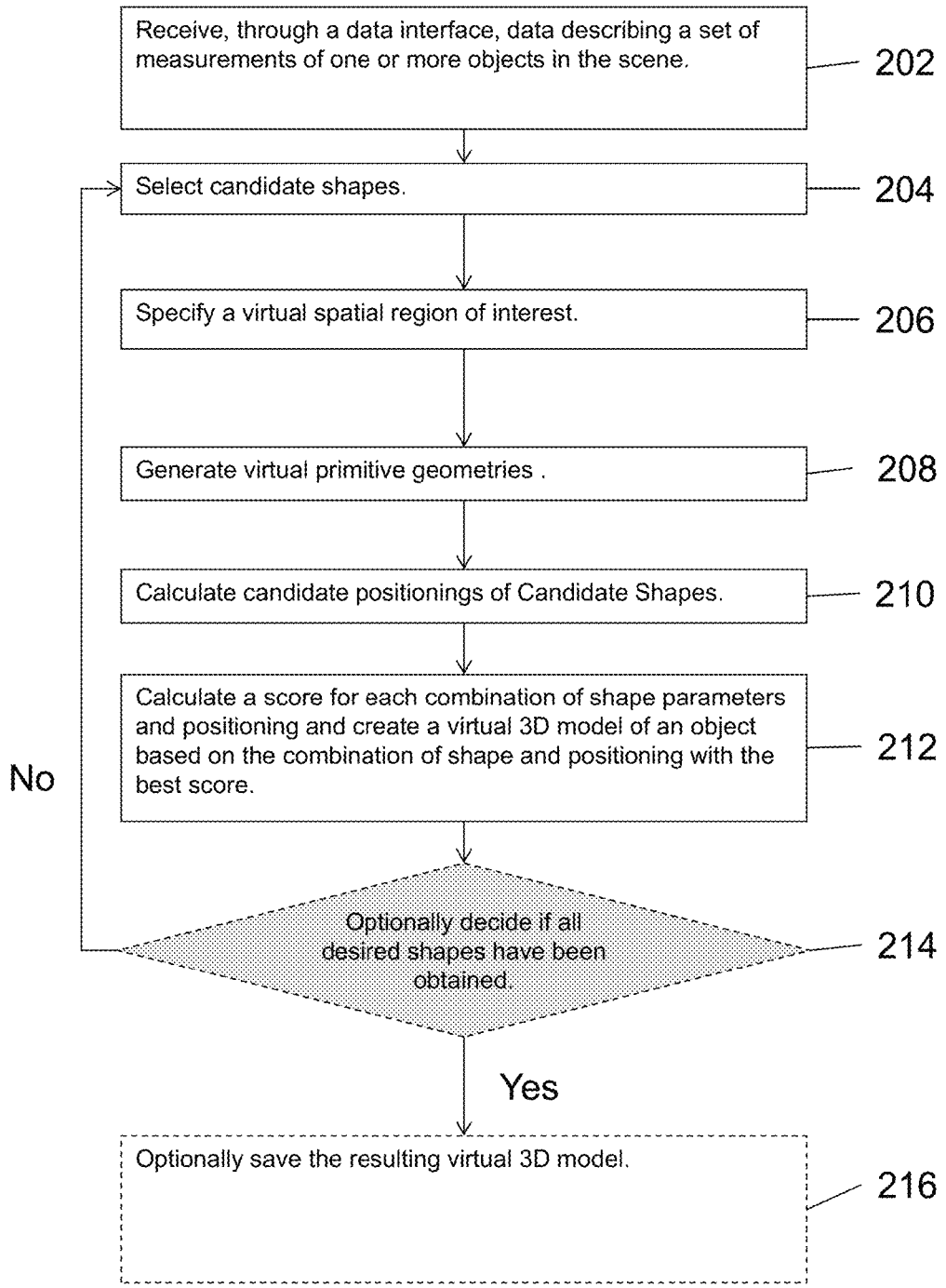
FIG. 2 is a flowchart illustrating processing operations for constructing a virtual 3D model of one or more objects within a scene, in accordance with one embodiment of the present invention.
Figure 4:
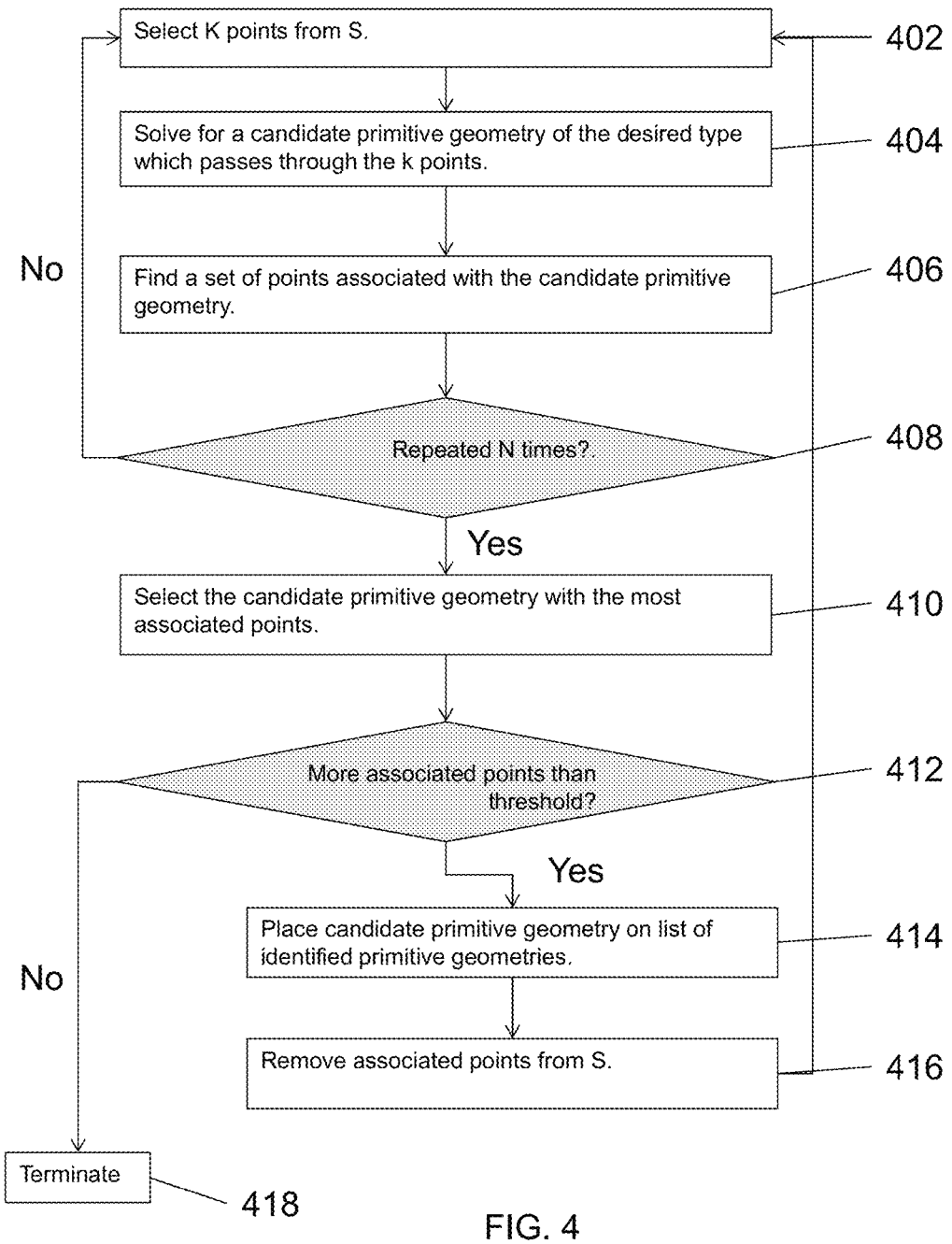
FIG. 4 is a flowchart illustrating steps involved in a RANdom SAmple Consensus (RANSAC) algorithm, in accordance with one embodiment of the present invention.

FIG. 1 is a block diagram of a computer system 100 configured in accordance with some embodiments of the present invention, wherein the computer system 100 is programmed, e.g., executes a set of instructions stored, for example, in memory 102, with a method according to some embodiments, e.g., the methods described in FIGS. 2 and 4. In some embodiments, the computer system 100 includes components suitable for use in 3D modeling. In some embodiments, the computer system 100 includes one or more of various components, such as a memory 102, a central processing unit (CPU) or controller 104, a display 106, input/output devices 108, and/or a bus 110. In some embodiments, the CPU comprises one or more individual processing units. In some embodiments, the bus 110 or another similar communication mechanism transfers information between the components of the computer system, such as a memory 102, CPU 104, display 106 and/or input/output devices 108. In some embodiments, information is transferred between some of the components of the computer system or within components of the computer system via a communications network, such as a wired or wireless communication path established with the internet, for example. In some embodiments the memory 102 includes a non-transitory, computer readable, storage medium. In some embodiments the memory 102 includes a volatile and/or a non-volatile, computer readable, storage medium. In some embodiments, a memory 102 stores a set of instructions to be executed by the CPU 104. In some embodiments, the memory 102 is also used for storing temporary variables or other intermediate information during execution of instructions to be executed by the CPU 104. In some embodiments, the instructions to be executed by the CPU 104 are stored in a portion of the memory 102 that is a non-transitory, computer readable, storage medium. In some embodiments, the instructions for causing a CPU 104 and computer system 100 to perform the described steps and tasks can be located in memory 102. In some embodiments, these instructions can alternatively be loaded from a disk and/or retrieved from a remote networked location. In some embodiments, the instructions may reside on a server, and are accessible and/or downloadable from the server via a data connection with the data interface. The data connection may include a wired or wireless communication path established with the Internet, for example.

In some embodiments, a Network Interface Card (NIC) 112 is included in the computer system 100, and provides connectivity to a network (not shown), thereby allowing the computer system 100 to operate in a networked environment. In some embodiments, computer system 100 is configured to receive data such as measurements that describe portions of a scene through the NIC 112 and/or the input/output devices 108.

In some embodiments, the memory 102 includes one or more executable modules to implement operations described herein. In some embodiments, the memory 102 includes a Point Cloud Analysis module 114. In some embodiments, the Point Cloud Analysis module 114 includes EdgeWise™ which is commercially available from ClearEdge 3D, Manassas, Va. In some embodiments, the Point Cloud Analysis module 114 also includes executable instructions for constructing a virtual 3D model of one or more objects within a scene. The operations performed by such a Point Cloud Analysis module 114 are discussed in greater detail in FIG. 2 below.

It should be noted that the Point Cloud Analysis module 114 is provided by way of example. In some embodiments, additional modules, such as an operating system or graphical user interface module are also included. It should be appreciated that the functions of the modules may be combined. In addition, the functions of the modules need not be performed on a single machine. Instead, the functions may be distributed across a network, if desired. Indeed, some embodiments of the invention are implemented in a client-server environment with various components being implemented at the client-side and/or server-side.

In some embodiments, the CPU 104 processes information and instructions, e.g., stored in memory 102.

In some embodiments, the computer system 100 further comprises a display 106, such as a liquid crystal display (LCD), cathode ray tube (CRT), or other display technology, for displaying information to a user. In some embodiments, a display 106 is not included as a part of computer system 100. In some embodiments, the computer system 100 is configured to be removably connected with the display 106.

In at least some embodiments, the memory 102 comprises a static and/or a dynamic memory storage device such as a hard drive, optical and/or magnetic drive, etc. for storing information and/or instructions. In some embodiments, a static and/or dynamic memory storage device and/or media 102 is configured to be removably connected with the computer system 100. In some embodiments, data such as measurements that describe portions of a scene are received by loading a removable media onto to appropriate device 102, for example by placing an optical disk into an optical drive, a magnetic tape into a magnetic drive, etc. In some embodiments, data such as measurements that describe portions of a scene are received by attaching a removable static and/or dynamic memory storage device 102, such as a hard drive, optical, and/or magnetic drive, etc. to the computer system 100.

FIG. 2 is a flowchart illustrating processing operations for constructing a virtual 3D model of one or more objects within a scene, in accordance with some embodiments of the invention. An exemplary set of operations (202-216) for constructing a virtual 3D model of one or more objects within a scene are discussed in detail below. In some embodiments, some or all of the exemplary set of operations (202-216) are stored in memory 102 as a sequence of instructions for execution by CPU 104.

Operation of Receiving, Through a Data Interface, Data Describing a Set of Measurements of Observed Portions of One or More Objects in the Scene.

An operation to receive, through a data interface, data describing a set of measurements of observed portions of one or more objects in the scene is performed (Block 202). In some embodiments, a computer system receives, through a data interface, a data set describing a set of measurements of one or more objects in a scene. In some embodiments, a data file containing a set of one or more laser scans of structural steel objects within a building are loaded onto a computer system 100 through a network interface card 112 and stored in memory 102 as illustrated in FIG. 1. In some embodiments, an optical storage disk containing photogrammetric measurements of a factory are placed in an optical disk drive.

In some embodiments, a cloud of point measurements of a scene (which in some embodiments is called a "point cloud") is loaded into the memory 102 of a computing device 100 for processing as illustrated in FIG. 1.

It should be noted that this is not an exclusive list of embodiments of this portion of an embodiment of the invention, other embodiments are possible.

Operation of Selecting Candidate Shapes

An operation to select candidate shapes of a virtual 3D model of an object is performed (Block 204). In some embodiments, a Point Cloud Analysis module 114 includes executable instructions to generate shape definitions based on a shape template (see glossary) and a set of parameters corresponding to that shape template. In some embodiments, some shape templates are linear extrusion shape templates, which include a template for a 2D cross section shape (such as a rectangular, an annular ring, or an I-beam cross section) and whose corresponding parameters, in some embodiments, include the parameters of the 2D cross section shape template and an extrusion distance. Such shape templates are well suited to modeling structural steel in buildings, since many of the structural steel components, such as I-Beams, angle-iron, or round tubing, have shapes which are well approximated by extrusions of 2D cross sections. In some embodiments, some shape templates are rotational extrusion shape templates, which, in some embodiments, include a template for a 2D cross section shape and whose corresponding parameters, in some embodiments, include the parameters of the 2D cross section shape template, a rotation radius and a rotational extrusion angular distance. In some embodiments, some shape templates define non-extruded shapes, such as pyramids, cones, or spheres.

Figure 3:
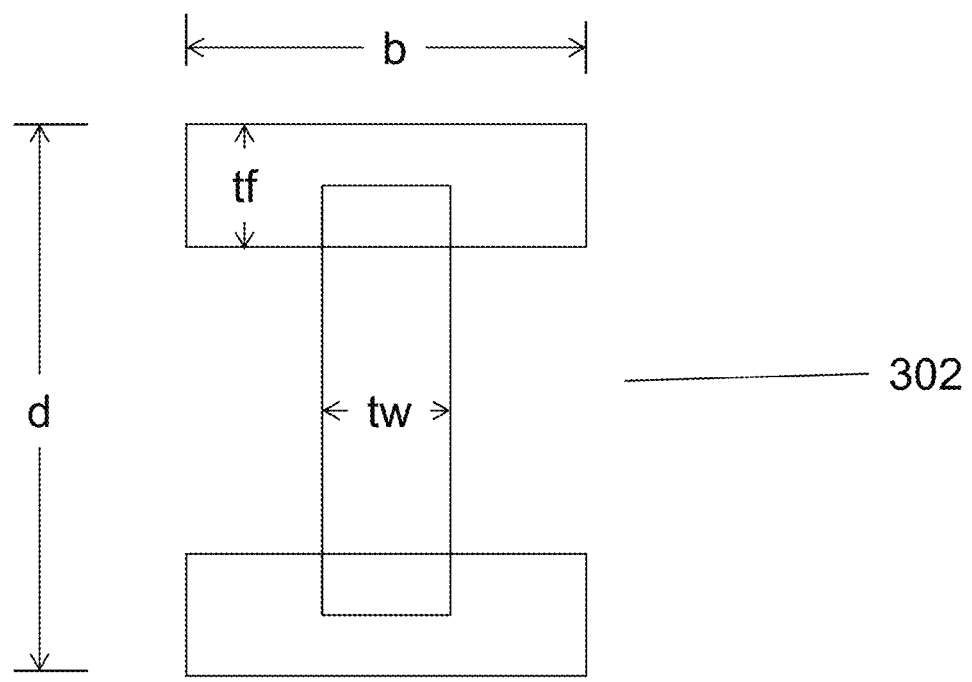
FIG. 3 is a diagram of a shape template for an extruded I-Beam and a corresponding set of standard sizes, in accordance with one embodiment of the present invention.

In some embodiments, a set of standard sizes are defined for a particular shape template which, in some embodiments, specify one or more of the parameters associated with the shape template. For example, FIG. 3 is a diagram of a set of standard sizes (Table 1 below) that, in some embodiments, exist for the parameters of the cross section of an I-Beam shape template (302). If all parameters of the shape template were specified in the standard size, then that size would fully define the shape. If only some of the parameters were specified, then, in some embodiments, the remaining (unspecified) parameters would be treated as continuous shape parameters. For example, in some embodiments a standard size specifying the parameters of the 2D cross section of an I-Beam shape template that does not specify the extrusion distance is defined. In some embodiments, such a standard size represents a set of I-Beam shapes with identical cross sections but different lengths, with the allowed lengths being a continuous parameter.

TABLE 1

Standard I-Beam Dimensions 1

| Name | d (Depth) | b (Width) | tf (Flange Thickness) | tw (Web Thickness) |
|---|---|---|---|---|
| W44X335 | 1.12 | 0.404 | 0.045 | 0.262 |
| W44X290 | 1.11 | 0.401 | 0.0401 | 0.022 |
| W40X593 | 1.09 | 0.424 | 0.082 | 0.0455 |
| W36X652 | 1.04 | 0.447 | 0.0899 | 0.05 |
| W36X441 | 0.988 | 0.432 | 0.062 | 0.0345 |

In some embodiments, a set of executable instructions defining one or more linear extrusion shape templates are included in the Point Cloud Analysis module 114.

In some embodiments, a user can define a new 2D cross section shape template for use in a linear or rotational extrusion shape template using an interactive 2D shape template editor.

In some embodiments, a set of parameters defining one or more standard sizes for one or more shape templates are loaded into memory 102.

In some embodiments, a set of parameters for a shape template can be specified interactively by a user.

In some embodiments, a set of candidate shapes are selected by selecting a shape template for which a Point Cloud Analysis module 114 includes executable instructions to generate shape definitions and a set of candidate standard sizes. In some embodiments, sets of standard sizes for one or more shape templates are saved in a "standard specification file" on a disk, and loaded into a Point Cloud Analysis module 114. In some embodiments, the application allows a user to select a shape template and a standard specification file containing standard sizes for that shape template as a means of selecting a set of candidate shapes. In some embodiments, the shape template is a linear extrusion shape template, and the set of candidate shapes is a set of extruded shapes of arbitrary lengths with cross sections specified by the 2D cross section shape template and the parameters contained in each standard size. For example, in some embodiments, a user can select an "I-Beam" shape template and select a "Pluto Steel 2007" standard file containing 20 standard I-Beam sizes, resulting in a set of candidate shapes where each shape in the set would have one of the 20 cross section shapes and be of arbitrary length. As an example, in some embodiments with shape templates which are not linear extrusion shape templates, a user can select a shape template for four-sided pyramids.

In some embodiments, a set of candidate shapes are selected by selecting an existing virtual 3D model of an object in the scene. In some embodiments, the set of candidate shapes are those defined by the shape template and standard size parameters used to generate the selected virtual 3D model. For example, in some embodiments, a user can select a virtual 3D model of an I-Beam that was generated using an "I45×60" standard size, in which case the set of candidate shapes would be the set of I-Beams with cross section specified by I45×60 and of arbitrary length. Such embodiments might have an advantage over those with multiple standard sizes in that the CPU cost of calculating scores for the shapes in the set might be significantly reduced due to the reduced number of potential cross sections.

In some embodiments, a set of candidate shapes are selected by selecting a shape template for which a Point Cloud Analysis module 114 includes executable instructions to generate shape definitions, without selecting a set of standard sizes. In some such embodiments, the set of candidate shapes are a set of shapes generated by the selected shape template using all combinations of arbitrary parameter values. In some such embodiments, the range of the parameter values are bounded above and/or below, or in a more complex manner. In some such embodiments, some of the parameters are specified. For example, in some embodiments, an "I-Beam" shape template is defined, with parameters length, height, width, flange thickness, and web thickness, with arbitrary length, height less than 1 m (one meter), width between 10 cm and 30 cm, web thickness of 2 mm and flange thickness of 2 cm.

It should be noted that this is not an exclusive list of embodiments of this portion of the invention, other embodiments are possible.

Operation of Specifying a Virtual Spatial Region of Interest

An operation to specify a virtual spatial region of interest is performed (Block 206). In some embodiments, the virtual spatial region of interest might contain a portion of an object for which a virtual 3D model is to be constructed. In some embodiments, a set of point measurements, such as those resulting from a laser scan, are loaded into memory 102. In some embodiments, the point measurements are displayed to an end user on a display 106, such as a LCD display, as a perspective view of a virtual scene from the point of view of a virtual camera location. In some embodiments, the user is able to use a data input device, such as a mouse, to cause the position and orientation of the virtual camera to move within the virtual scene. In some embodiments, the user is also able to use a data input device, such as a mouse, to specify a virtual polygon in a virtual plane perpendicular to the line of sight of the virtual camera. In some such embodiments, the 2D region defined by the virtual polygon is extruded along the line of sight of the virtual camera to specify a virtual spatial region of interest. In some embodiments, the user specifies the virtual polygon in such a way that the virtual spatial region of interest includes some of the measurement points corresponding to an object for which it is desired to create a virtual 3D model.

It should be noted that this is not an exclusive list of embodiments of this portion of the invention, other embodiments are possible. For example, in some embodiments measurement data created by photogrammetry are displayed in a virtual scene. In some embodiments a virtual scene is displayed using an orthographic view. In some embodiments, a virtual spatial region of interest is specified as the portion of a virtual scene which is occluded from the perspective view of a virtual camera by a virtual 2D polygonal region specified by a user.

Operation of Generating Virtual Primitive Geometries

An operation to generate virtual primitive geometries is performed (Block 208). In some embodiments, a set of point measurements, such as those resulting from a laser scan, is loaded into memory 102 and a virtual location is assigned to each point measurement. In some embodiments, a user specifies a virtual spatial region of interest. In some embodiments, an "Extraction Set" of measured data is be created by comparing the virtual locations of a set of measured points with a virtual spatial region of interest, with, in some embodiments, points lying inside the region of interest being added to the extraction set and points lying outside the region of interest being excluded from the extraction set.

In some embodiments, a RANdom SAmple Consensus (RANSAC) algorithm is used to identify one or more virtual primitive geometries, such as portions of planes or cylinders, from the measurements within an extraction set. In some embodiments a RANSAC algorithm for finding one or more primitive geometry from a set S of points consists of the following steps, as in FIG. 4.

1) Select k points from S, where k is the minimum number of points needed to determine the parameters of a desired primitive geometry (Block 402). For example, k might be 3 when attempting to find a plane.

2) Solve for a candidate primitive geometry of the desired type which passes through the k points (Block 404).

3) Find a set of points associated with the candidate primitive geometry by selecting all points in S whose distance from the candidate primitive geometry is less than some tolerance and record both the candidate primitive geometry and the number of points associated with it (Block 406).

4) Repeat steps 1 through 3 a specified number of times for each of the desired geometry types (Block 408).

5) Select the candidate primitive geometry with the most associated points (Block 410). If it has more associated points than some threshold number (Block 412), place it on a list of "identified" primitive geometries (Block 414) and remove the associated points from S (Block 416), otherwise terminate the process (Block 418).

6) Repeat steps 1 through 5 until the process terminates.

It should be noted that this description is intended as an example of an embodiment using a RANSAC algorithm; other embodiments using RANSAC algorithms are possible, as are other embodiments that use other methods to identify one or more virtual primitive geometries from a set of measured points. For example, in some embodiments a plane geometry is be proposed by finding a set of nearest neighbors to a point and finding a plane geometry which minimizes the least squares distance from the points to the plane.

In some embodiments, only planes are considered when identifying virtual primitive geometries.

In some embodiments, a portion of a primitive geometry is identified by defining a bounding shape, in the parameter space of the geometry, which contains the projections of all points which were associated with that geometry. For example, in some embodiments a bounding rectangle (in u and v) is defined for a plane with coordinates u and v by finding the maximum and minimum values of u and v obtained when projecting all of the plane's associated points into the plane.

In some embodiments, candidate cylinders are proposed in a RANSAC algorithm by selecting 5 points from an extraction set and using their virtual locations to determine the parameters for one or more virtual cylinders using the techniques described in "Direct Solutions for Computing Cylinders from Minimal Sets of 3D Points", Beder and Foerstner, Computer Vision—ECCV 2006, Lecture Notes in Computer Science Volume 3951, 2006, pp 135-146.

Figure 5:
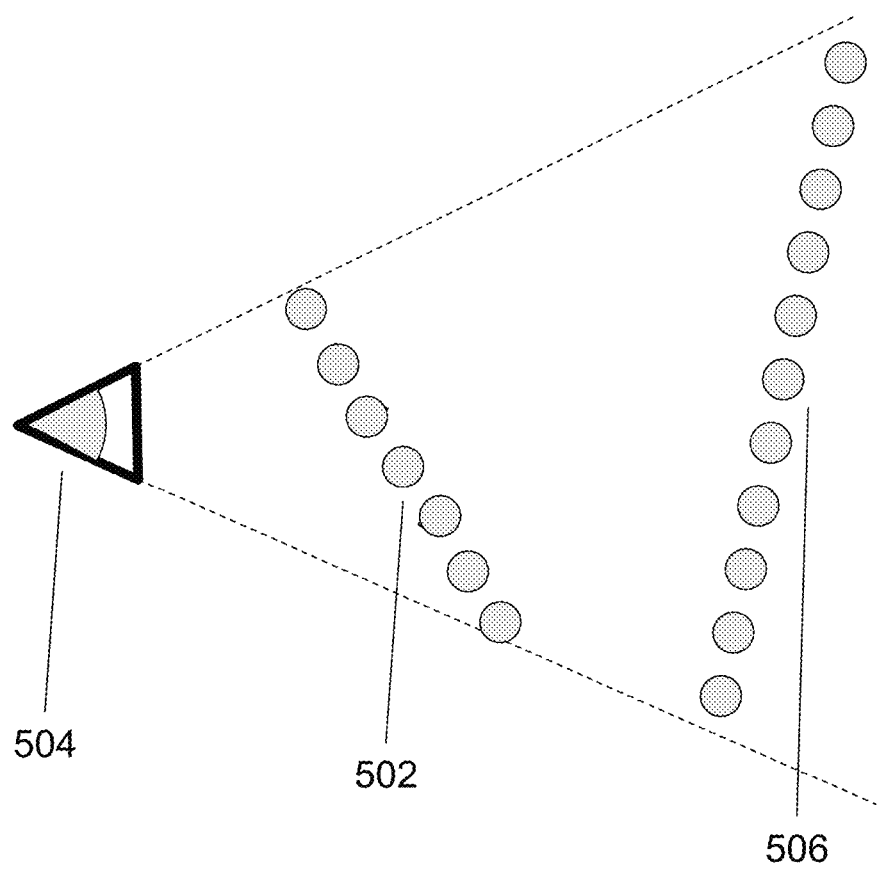
FIG. 5 is a diagrammatic depiction of classification of points as being either foreground or background relative to a virtual camera position, in accordance with one embodiment of the present invention.

In some embodiments, the k points used to determine the parameters of a candidate primitive geometry are selected from a subset of S and/or using a non-uniform weighting. In some embodiments, the virtual locations of measured points within an extraction set are compared to a virtual camera location which was used to generate a region of interest which in turn was used to generate the extraction set. In some embodiments, the distance DNear from the virtual camera location to the nearest virtual point location is determined, and points for whom the distance between their virtual location and the virtual camera location was less than (DNear+distance tolerance) are classified as "Foreground Points" 502 with respect to the camera location 504, as in FIG. 5. In some embodiments, those points in the extraction set which are not classified as foreground points are classified as background points 506. In some embodiments, a random sample of N points is selected from the foreground points 502 to form a "Proposal Set". In some embodiments, the closest M<N points are identified and duplicated t times, with the duplicates being added to the proposal set. In some embodiments, the k points used to determine the parameters of a candidate primitive geometry in a RANSAC algorithm are selected from the proposal set, while the associated points are still identified by comparing the points in S to the candidate primitive geometry. For example, in some embodiments RANSAC is performed using a proposal set generated by randomly selecting 2000 points from the foreground points 502, identifying within this set of 2000 points the 400 points closest to the (virtual) cameral location 504, and combining 5 copies of each of these 400 points and 1 copy of the other 1600 points to form the proposal set.

In some embodiments, a virtual 2D grid is created in a plane perpendicular to the virtual camera direction, and the points in the extraction set are classified according to the grid cell into which they fall when projected into that plane. In some such embodiments, a value of DNear is be found for each set of points associated with a grid cell, and the classification of foreground 502 points for each such set of points might be based on the value of DNear associated with the corresponding grid cell.

In some embodiments, each measurement point has a measurement device location associated with it, for example in some embodiments a laser scanner position is associated with each point in a laser scan point cloud. In some embodiments, the measurement device location of a point is used to infer which side of the surface upon which the point lies corresponds to the inside of the object being measured and which side lies on the outside. For example, in some embodiments, this inference is based on the principle that a laser beam used to perform a measurement will approach the object being measured from the outside direction. In some embodiments, this inside/outside determination is in turn used to resolve the ambiguity between the two possible normals of a virtual primitive geometry. In some embodiments, a candidate geometry with a normal vector pointing in a particular direction at a particular point is considered a distinct candidate from a candidate geometry that occupies the same points in space but whose normal vectors point in the opposite directions. In some embodiments, the procedure for associating points with candidate geometries also includes a consistency condition that the normal vector of the candidate geometry at the projection of the measurement point onto the candidate geometry has a positive dot product with the vector from the measurement point to the measurement device location for that point. In some embodiments, this consistency condition is interpreted as requiring that only points that can be "seen" by a measurement device without being occluded by the object being measured are allowed to be associated with a surface being proposed as a portion of the boundary of that object.

It should be noted that this is not an exclusive list of embodiments of this portion of the invention, other embodiments are possible.

Operation of Calculating Candidate Positionings of Candidate Shapes

An operation to generate candidate positionings of candidate shapes is performed (Block 210). In some embodiments, a set of candidate positionings is generated for each shape or group of shapes based on a set of virtual primitive geometries that have been identified from a set of measurement data. In some embodiments, a positioning of a shape is specified by specifying a reference point on the shape, a location in (virtual) XYZ space where that reference point is located, and an orientation of that shape around the reference point, which in turn, in some embodiments, is specified by specifying two (non-parallel) reference directions in the local coordinate system of the shape and the associated directions in XYZ space of these reference directions.

In some embodiments, a set of candidate shapes are selected by selecting a linear extrusion shape template and a set of standard 2D sizes for its 2D cross-section shape template. In some embodiments, the 2D cross-section shape template contains at least one edge whose geometry is a straight line segment, with each such edge corresponding to a planar face in the 3D shape template. In some embodiments, each straight line segment is aligned to only be parallel or perpendicular to each of the other straight line segments. In some embodiments, all of the edges defining the 2D cross section are straight line segments, and a set of 2D reference points on the cross section are defined as the set of corners where adjacent line segments meet. In some embodiments, some 2D reference points are defined as the intersection of non-adjacent perpendicular straight line segments. For example, in some embodiments a 2D cross-section shape template includes a 90 degree circular arc between two adjacent straight line segments, representing a filleted (rounded) edge in the extruded shape, and a reference point is defined to lie at the intersection of the adjacent straight line segments. In some embodiments, this location is interpreted as the location of an edge between the two planar faces (corresponding to the straight line segments) that would be generated if the fillet (rounding) was removed. It should be noted that this is not an exclusive list of embodiments that define reference points based on a shape template; other embodiments are possible. For example, in some embodiments, reference points for a set of tetrahedral shapes are defined as the four corners of each tetrahedron.

In some embodiments, a dominant direction is determined from a set of virtual primitive geometries and used to determine an extrusion direction for candidate positionings of linearly extruded shapes. In some embodiments, a set of virtual primitive geometries identified from a measurement set includes a set of virtual planes. In some embodiments, a primary plane is identified by selecting the plane that has the largest number of associated points. In some embodiments, a secondary plane is identified by selecting the plane that has the largest number of associated points among the planes that are within some angular tolerance of being perpendicular to the primary plane. For example, in some embodiments, an angular tolerance of 5 degrees is used and the secondary plane is selected among the planes whose normals formed an angle between 85 and 95 degrees with the normal of the primary plane. In some embodiments, a dominant direction is defined as the cross product of the normal of a primary plane with the normal of a secondary plane, and an extrusion direction is defined as being equal to the dominant direction.

Figure 6:
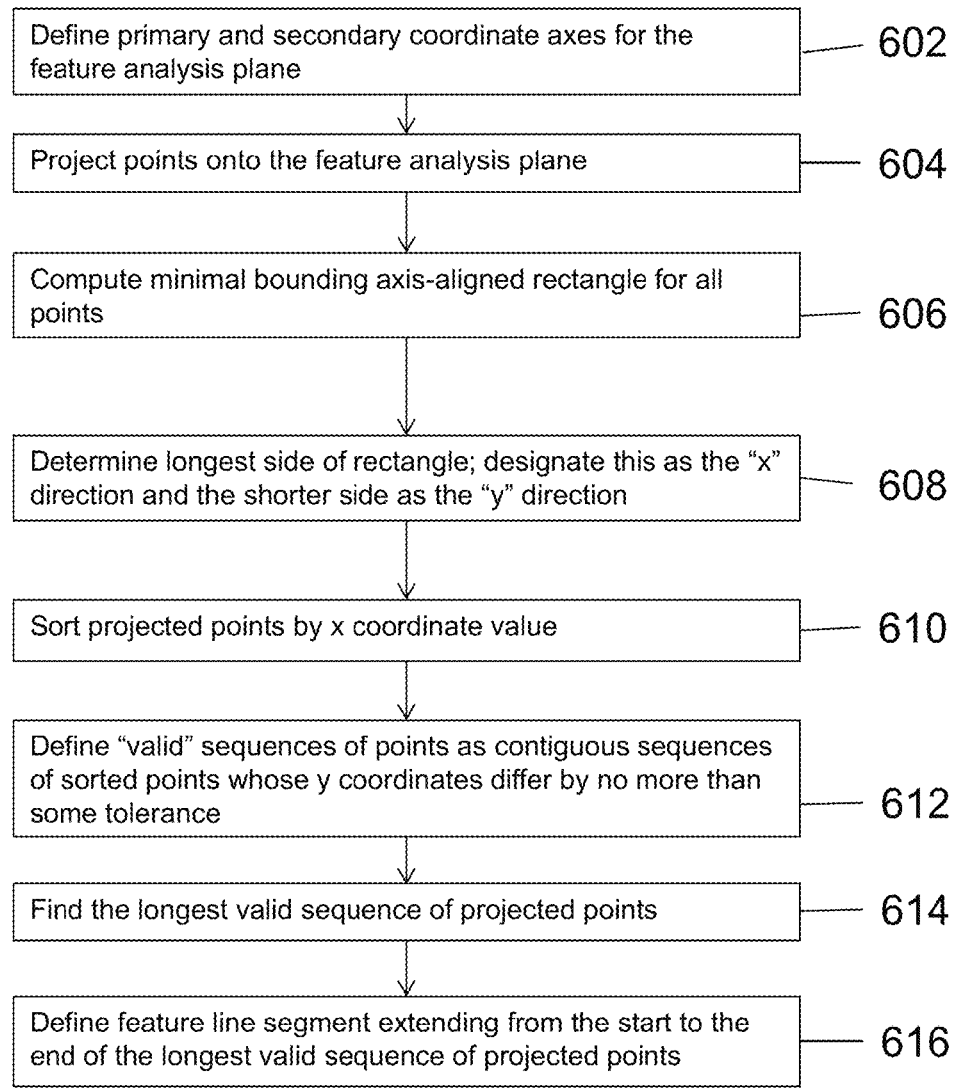
FIG. 6 is a flowchart of a method of finding a feature line segment associated with a planar primitive geometry, in accordance with one embodiment of the present invention.

FIG. 6 is a flowchart of a method of finding a feature line segment associated with a planar primitive geometry. In some embodiments, a feature analysis plane is defined as being perpendicular to an extrusion direction that was determined from a set of virtual primitive geometries. In some embodiments, a subset of planar primitive geometries are selected as those primitive geometries which are planar and whose normals are within some tolerance of perpendicular to the extrusion direction; in some embodiments this subset is designated the extrusion subset of primitive geometries. In some embodiments, a primary direction is defined in the feature analysis plane as the projection of a primary plane's normal into the feature analysis plane, and a secondary direction is defined as a direction in the feature analysis plane perpendicular to the primary direction. In some embodiments, a feature line segment in the feature analysis plane is generated for each planar primitive geometry in the extrusion subset. In some embodiments, a feature line segment associated with a planar primitive geometry is found by performing the following steps:

1) Define primary and secondary coordinate axes in the feature analysis plane 602 such that the primary axis is parallel to the primary direction and the secondary axis is parallel to the secondary direction, and use these axes to define a coordinate system for the feature analysis plane with coordinates p and s corresponding to the primary and secondary axes, respectively.

2) Project all associated points into the feature analysis plane 604 to form a set of projected points.

3) Find the minimal bounding rectangle in the (p,s) coordinate system that encompasses all the projected points 606.

4) Determine the direction of the feature line segment to be the direction of the longest side of the minimal bounding rectangle 608, which will be either the p or s direction. Designate the direction of the feature line segment (either p or s) to be the "x" direction and the orthogonal direction to be the "y" direction.

5) Sort the projected points in increasing order of their x coordinates 610.

6) Define a "valid" sequence of points as a contiguous sequence of sorted projected points whose y coordinates differ by no more than some tolerance 612.

7) Find the longest valid sequence of projected points 614, where longest is define as having greatest difference in x coordinates between the first projected point and the last projected point in the sequence.

8) Define the feature line segment from the longest valid sequence as beginning at the location of the first projected point, running in the x direction, and terminating at the x value of the last projected point 616.

It should be noted that this is not an exclusive list of embodiments of defining a feature curve in a feature extraction plane from a virtual primitive geometry. Other embodiments use a different mechanism for determining a y coordinate of a feature line segment, or relax the conditions of linearity or perpendicularity of the feature curves.

In some embodiments, a set of candidate feature points in a feature extraction plane are generated by generating a set of feature lines (of infinite extent) by unbounding a set of feature line segments and finding all points of intersection between feature lines. In some embodiments an intersection between feature lines is only included in the set of candidate feature points if the inside/outside orientations of the associated virtual primitive geometries are consistent with both geometries forming part of the boundary of the same object.

In some embodiments, a set of candidate feature points in a feature extraction plane are combined with a set of reference points on the 2D cross sections of a set of candidate linear extrusion shapes to determine a set of candidate positionings of the candidate shapes. In some embodiments, the feature extraction plane is chosen so that all measurement points associated with a primitive geometry used to generate a feature line segment lie on one side of the feature extraction plane. In some embodiments, this is ensured by requiring that the dot products of the feature extraction plane's normal with a displacement vector from the feature extraction plane to each measurement point all have the same sign. In some embodiments, the extrusion lengths of the extrusion shapes are chosen to be the distance from such a feature extraction plane to the furthest measurement point associated with a primitive geometry used to generate a feature line segment, and the 3D reference points for such an extruded shape are defined as the location of the 2D cross section reference points on each of the two ends of the extruded shape. In some embodiments, a candidate positioning of such a shape is defined in such a way that a 3D reference point on the shape is coincident with one of the feature points in the feature extraction plane, that the extrusion direction of the shape is parallel to the direction of the feature extraction plane's normal vector and oriented so that the material of the shape is on the same side of the feature extraction plane as the measurement points associated with the feature line segments, and so that at least one edge within the shape's 2D cross section is parallel to at least one feature line segment in the feature extraction plane. In some embodiments, such a candidate positioning can be thought of in 2D as placing the shape's 2D cross section (or a 2D mirror image of the shape's 2D cross section) in the feature extraction plane so that a 2D reference point is coincident with a feature point and rotating the cross section shape so that at least one edge in the cross section is parallel to at least one feature line segment. In some embodiments, a set of candidate positionings are generated for a particular linear extrusion shape by enumerating all pairings between 2D reference points on the shape's cross section (and the mirror image of the shape's cross section) and feature points in a feature extraction plane and, for each pairing, enumerating all 2D rotations of the cross section around the reference point so that at least one edge of the cross section is parallel to at least one feature edge.

In some embodiments, virtual primitive cylindrical geometries whose cross sections are perpendicular to the extrusion direction within some tolerance are identified and included in an extrusion subset, and, in some embodiments, their associated points are projected into a feature analysis plane. In some embodiments, circular 2D arcs are extracted from each such geometry's associated points and be scored against circular arc edges in the 2D cross section of a linearly extruded candidate shape. In some embodiments, other virtual primitive geometries which can be interpreted as extrusions of a 2D curve in a direction close to the extrusion direction have their associated points projected into the feature analysis plane, 2D curves are extracted from each such geometry's associated points and scored against corresponding curves in the 2D cross section of a linearly extruded candidate shape.

In some embodiments, measurement device location data is used to determine inside and outside sides of primitive geometries. In some embodiments, when comparing a primitive geometry with a face in a candidate shape in order to score a positioning of the candidate shape, a consistency condition is added that requires the outside side of the primitive geometry to match the outside side of the face with which it is being compared in order for the primitive geometry to be considered a match for the face.

It should be noted that this is not an exclusive list of embodiments of this portion of the invention, other embodiments are possible.

Operation of Calculating a Score for Each Combination of Shape Parameters and Positioning and Create a Virtual 3D Model of an Object Based on the Combination of Shape and Positioning with the Best Score An operation to calculate a score for each combination of shape parameters and positioning and select the combination of shape and positioning with the best score is performed (Block 212). In some embodiments, each shape in a set of candidate shapes for the virtual model of a 3D object has a set of associated candidate positionings. In some embodiments, each shape is a linear extrusion shape, and its positionings might be thought of in terms of placing the shape's 2D cross section (or a mirror image of the 2D cross section) in a feature extraction plane and applying a specified 2D rotation. In at some embodiments, for each positioning the locations of the straight edges in the cross section are compared to the locations of the feature line segments associated with primitive geometries. In some embodiments, if a straight edge is close to a feature line segment a value, such as the length of the region where the two line segments overlap, is added to the total score of that particular combination of shape and positioning. In some embodiments, if a feature line segment disagrees with the 2D cross section, for example by extending beyond the end of a straight edge or lying in whole or in part within the interior of the 2D cross section, then a value is subtracted from the score. In some such embodiments, a combination of shape and positioning that has a higher score than some other combination of shape and positioning is considered to have a better score than that other combination, and the combination of shape and positioning with the highest score is considered to have the best score.

In some embodiments, a Point Cloud Analysis module 114 includes executable instructions to create and manage a virtual 3D model of zero, one or more objects within a scene. After calculating a score for each combination of shape and positioning, the combination with the best score is selected and used to generate a virtual 3D model of an object having that shape and having a location and orientation determined by the positioning, and, in some embodiments, that virtual 3D model of an object is added to a virtual 3D model of zero, one or more objects within a scene that is being managed by a Point Cloud Analysis model 114.

It should be noted that this is not an exclusive list of embodiments of this portion of the invention, other embodiments are possible. For example, in some embodiments a set of candidate shapes are not linear extrusion shapes. In some such embodiments, a score is assigned to a combination of shape and positioning based on the number of measurement points associated with a primitive geometry which lie near a face on the positioned shape. In some embodiments, a scoring algorithm is used such that the combination of shape and positioning that has the lowest score is considered the combination with the best score.

In some embodiments, a Point Cloud Analysis module 114 includes executable instructions to display a view of a virtual 3D model of one or more objects within a scene upon a display device 106. In some embodiments, it also includes executable instructions allowing a user to modify the shape of a virtual model of an object by manipulating an input device such as a mouse or a keyboard. For example, in some embodiments, the user is able to virtually pull on a virtual arrow attached to an end of a virtual model of an object with a linear extrusion shape in order to increase or decrease the length of the object or be able to pull on a virtual ball in order to change the extrusion direction of the virtual model of the object. In some embodiments, the user also is be able to provide inputs that will spin a virtual model of an object with an extruded shape around its axis, or rotate a virtual model of an object with a general shape, such as a tetrahedron.

In some embodiments, a Point Cloud Analysis module 114 includes executable instructions to display a 2D cross section view of a selected virtual 3D model of one an object. In some embodiments, such a 2D cross section view displays the projection into a feature extraction plane of points in an extraction set associated with a region of interest that was used to generate the virtual 3D model of an object and/or, in some embodiments, displays an outline of the 2D cross section's shape. In some embodiments, a user is able to select a new 2D cross section shape and visually compare the new cross section's shape with the projection of the extraction set points into the feature extraction plane.

Operation of Deciding if all Desired Shapes have been Obtained.

An operation to optionally decide if all desired shapes have been obtained might now be performed (Block 214). In some embodiments, a user optionally decides if a virtual 3D model that has been constructed contains all of the desired shapes. If it does not contain all of the desired shapes, in some embodiments, the user is able to repeat the operations above beginning with the operation of selecting candidate shapes (Block 204) or, in some embodiments, with the operation of specifying a virtual spatial region of interest which might contain a portion of an object for which a virtual 3D model is to be constructed (Block 206) in the case where the selected candidate shapes can be reused.

Operation of Optionally Saving the Resulting Virtual 3D Model.

An operation of optionally saving the resulting virtual 3D model is performed (Block 216). In some embodiments, the user saves a virtual 3D model of shapes to a storage device such as a hard disk drive, a thumb drive, or an optical drive.

Description of a given embodiment is useful to describe the operation of at least one embodiment of the above operations. In this embodiment, execution of a software application causes a processor to load a set of laser scan point measurements of a scene such as an industrial plant. The scene contains one or more steel columns, beams or braces with various cross sections, such as I-Beam, Angle-Iron, or Round Tubing. A user selects a catalog of standard steel cross-section shapes, defined by a standards body such as AISC (American Institute of Steel Construction). A representation of the scene and the point measurements is shown on a graphical display device from the point of view of a virtual camera. The user navigates the location of the virtual camera to a desired location within the scene, and selects a region of interest containing a particular piece of steel, for example an I-Beam, by specifying a virtual polygon on the display device. The user selects the set of I-Beam cross sections (sizes) from the catalog of steel cross section shapes as candidate shapes. Execution of the application then causes the processor to generate planar primitive geometries within the region of interest by performing a RANSAC algorithm on the point measurements lying within the region of interest. These primitive geometries are used by the executing application to generate a set of feature points, and the feature points are compared with a set of reference points on each potential I-Beam cross section to calculate a set of candidate positionings for the I-Beam cross-sections. Each candidate positioning of an I-Beam cross-section is then compared to the planar geometries and assigned a score based on the goodness of fit to those planar geometries. The application then selects the highest scoring I-Beam cross-section and location to create a virtual model of the I-Beam. This procedure is then repeated for other pieces of steel until a virtual 3D model of the desired pieces of steel has been obtained.

Efficiently creating a virtual 3D model from a point cloud of points obtained by scanning a scene remains as a hurdle for creating virtual 3D models of industrial facilities. A robust method that enables a user to easily select a set of scanned points and extract an appropriate shape that accurately fits those points allows the creation of virtual 3D models of industrial facilities to become more economically viable.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Those skilled in the art should also realize that such equivalent constructions do not depart from the spirit and scope of the present disclosure, and that they may make various changes, substitutions, and alterations herein without departing from the spirit and scope of the present disclosure. It is therefore intended that the protection granted hereon be limited only by the definition contained in the appended claims and equivalents thereof.

What is claimed is:

1. A method of constructing a virtual 3D model of one or more objects within a scene, said virtual 3D model containing one or more flat faces on at least one of the objects constructed, said method comprising:
   receiving, through a data interface, measurement data describing a set of measurements of observed portions of the one or more objects within the scene;
   selecting one or more candidate shapes;
   specifying a virtual spatial region of interest;
   generating one or more virtual primitive geometries from the measurement data corresponding to the virtual spatial region of interest;
   calculating candidate positionings of the one or more candidate shapes relative to the one or more virtual primitive geometries;
   calculating a score for each combination of a plurality of combinations of shape parameters and the calculated candidate positionings; and
   creating a virtual 3D model of an object of the one or more objects based on the combination of the plurality of combinations with a best score.

2. The method of claim 1, wherein selecting the one or more candidate shapes comprises:
   obtaining one or more shape definitions, said one or more shape definitions defining possible shapes of the virtual 3D model to be constructed from the measurement data, each of said possible shapes containing one or more primitive geometry regions;
   classifying the one or more shape definitions into type groups, each type group of said type groups comprising a collection of the one or more shape definitions having similar patterns of the one or more primitive geometry regions; and
   selecting one or more candidate shape definitions from a same type group of the type groups.

3. The method of claim 1, wherein the one or more candidate shapes selected includes a subset of candidate shapes which are capable of being parameterized by one or more continuous parameters.

4. The method of claim 1, wherein selecting the one or more candidate shapes comprises at least one of:

obtaining one or more shape definitions, said one or more shape definitions defining possible shapes of the virtual 3D model to be constructed from the measurement data, each of said possible shapes containing one or more primitive geometry regions;

classifying the one or more shape definitions into type groups, each type group of said type groups comprising a collection of the one or more shape definitions having similar patterns of the one or more primitive geometry regions; or selecting one or more candidate shape definitions from a same type group of the type groups.

5. The method of claim 4, wherein calculating the candidate positionings of the one or more candidate shapes comprises calculating a set of possible positionings based on a pattern of the one or more primitive geometry regions associated with the type group to which the selected one or more candidate shape definitions belong, and on the one or more virtual primitive geometries.

6. The method of claim 4, wherein
calculating the score for each combination of the plurality of combinations comprises:
for each selected candidate shape definition and each possible candidate positioning, calculating the score for that particular shape definition and candidate positioning combination, said score being based on the selected candidate shape definition, the candidate positioning, and the one or more virtual primitive geometries, and
creating the virtual 3D model of the one or more objects comprises:
selecting the combination of selected candidate shape definition and candidate positioning with the best score; and
creating the virtual 3D model of the object of the one or more objects whose shape is determined by the selected candidate shape definition with the best score and whose location and orientation are determined by the candidate positioning with the best score.

7. The method of claim 4, wherein the obtained one or more shape definitions are received through a data interface or user input device.

8. The method of claim 4, wherein obtaining the one or more shape definitions comprises allowing a user to select a previously constructed virtual 3D model of a previously modelled object and wherein the one or more shape definitions comprise a shape definition used to create said previously constructed virtual 3D model.

9. The method of claim 4, wherein each of the one or more shape definitions comprises a definition of a 2D cross section which can be extruded to create a 3D shape.

10. The method of claim 9, wherein the one or more virtual primitive geometries include at least one of a planar geometry or a cylindrical geometry.

11. The method of claim 9, wherein calculating the score for each of the one or more shape definitions and each possible candidate positioning comprises:
projecting the measurement data into a positioned plane of a cross-section of the shape definition; and
calculating one or more primitive 2D curve geometries based on the projected measurement data,
wherein the score depends on said primitive 2D curve geometries.

12. The method of claim 1, wherein specifying the virtual spatial region of interest comprises receiving from a user, through an input device, data specifying said virtual spatial region of interest, and wherein said virtual spatial region of interest is capable of containing a portion of an object of the one or more objects for which the virtual 3D model is to be constructed.

13. The method of claim 1, wherein specifying the virtual spatial region of interest comprises selecting a virtual camera location and orientation corresponding to a location and a direction within the scene and presenting to a user, on a display device, a 3D graphical representation of the measurement data, said 3D graphical representation being dependent upon the virtual camera location.

14. The method of claim 13, wherein the virtual camera location and orientation are capable of being adjusted by the user.

15. The method of claim 14, wherein the virtual camera location is allowed to correspond to one or more locations other than one or more scanner locations used to obtain the measurement data.

16. The method of claim 15, wherein generating the one or more virtual primitive geometries comprises:
generating an extraction set, said extraction set comprising a subset of the measurement data, said subset containing measurements lying within the virtual spatial region of interest; and
generating the one or more virtual primitive geometries based on the extraction set and the virtual camera location.

17. The method of claim 16, wherein generating the one or more virtual primitive geometries further comprises:
randomly selecting a set of points from the extraction set, a weight of each point within said randomly selected set depending on the camera location and a point location;
calculating a primitive geometry candidate based on the randomly selected set of points;
associating a subset of the points in the extraction set with the primitive geometry candidate;
assigning a candidate score to the primitive geometry candidate based on the subset of points associated with that primitive geometry candidate;
repeating the randomly selecting the set of points, calculating the primitive geometry candidate, associating the subset of the points, and assigning the candidate score to the primitive geometry candidate N times, N being a non-zero positive integer;
choosing the primitive geometry candidate with a highest candidate score as a generated virtual primitive geometry of the one or more virtual primitive geometries;
removing the subset of points associated with the generated virtual primitive geometry from the extraction set; and
repeating the randomly selecting the set of points, calculating the primitive geometry candidate, associating the subset of the points, assigning the candidate score to the primitive geometry candidate, choosing the primitive geometry candidate, and removing the subset of points until a stopping criterion is met.

18. The method of claim 1, wherein the selecting the one or more candidate shapes, the specifying the virtual spatial region of interest, the generating the one or more virtual primitive geometries, the calculating the candidate positionings, the calculating the score, and the creating the virtual 3D model of the object of the one or more objects are repeated until a desired number of virtual models of 3D objects have been created.

19. The method of claim 1, wherein the received measurement data includes location data for one or more measurement devices and generating the one or more virtual primitive geometries is based on said location data.

20. The method of claim 1, wherein the one or more virtual primitive geometries include orientation information.

21. A system for constructing a virtual 3D model of one or more objects within a scene, said virtual 3D model containing one or more flat faces on at least one of the objects constructed, the system comprising:
   a processor; and
   a memory storing instructions which, when executed by the processor, cause the processor to:
      receive, through a data interface, data describing a set of measurements of observed portions of the one or more objects in the scene;
      select one or more candidate shapes;
      specify a virtual spatial region of interest;
      generate one or more virtual primitive geometries from the data corresponding to the virtual spatial region of interest;
      calculate candidate positionings of the one or more candidate shapes relative to the one or more virtual primitive geometries;
      calculate a score for each combination of a plurality of combinations of shape parameters and the calculated candidate positionings; and
      create a virtual 3D model of an object of the one or more objects based on the combination of the plurality of combinations with a best score.

22. A non-transitory, computer-readable storage medium storing instructions which, when executed by a processor, cause the processor to:
   receive, through a data interface, data describing a set of measurements of observed portions of the one or more objects in the scene;
   select one or more candidate shapes;
   specify a virtual spatial region of interest;
   generate one or more virtual primitive geometries from the data corresponding to the virtual spatial region of interest;
   calculate candidate positionings of the one or more candidate shapes relative to the one or more virtual primitive geometries;
   calculate a score for each combination of a plurality of combinations of shape parameters and the calculated candidate positionings; and
   create a virtual 3D model of an object of the one or more objects based on the combination of the plurality of combinations with a best score.

* * * * *